(12) United States Patent  
Nakanishi

(10) Patent No.: US 8,212,957 B2
(45) Date of Patent: Jul. 3, 2012

(54) MOUNT STRUCTURE, ILLUMINATION APPARATUS AND LIQUID CRYSTAL APPARATUS

(75) Inventor: Daisuke Nakanishi, Matsumoto (JP)

(73) Assignee: Sony Corporation, Tokyo (JP)

( * ) Notice: Subject to any disclaimer, the term of this patent is extended or adjusted under 35 U.S.C. 154(b) by 200 days.

(21) Appl. No.: 12/647,956

(22) Filed: Dec. 28, 2009

(65) Prior Publication Data
US 2010/0182529 A1 Jul. 22, 2010

(30) Foreign Application Priority Data
Jan. 22, 2009 (JP) ................................. 2009-011670

(51) Int. Cl.
*G02F 1/1333* (2006.01)
(52) U.S. Cl. .......................................... 349/58; 349/64
(58) Field of Classification Search .................. None
See application file for complete search history.

(56) References Cited

U.S. PATENT DOCUMENTS
2006/0268194 A1* 11/2006 Morimoto et al. .............. 349/65

FOREIGN PATENT DOCUMENTS
JP 2006-011239 1/2006
JP 2008-009038 1/2008

\* cited by examiner

*Primary Examiner* — Thanh-Nhan P. Nguyen
(74) *Attorney, Agent, or Firm* — K&L Gates LLP

(57) ABSTRACT

A mount structure includes a wiring board and a semiconductor device composed of a light-emitting device or a light-receiving device mounted on one surface side of the wiring board such that an optical axis thereof is oriented in a direction that extends along a board surface of the wiring board. On the one surface side of the wiring board, a first pad on which a first terminal of the semiconductor device is mounted, a second pad on which a second terminal of the semiconductor device is mounted, and a light-shielding conductive layer are formed using the same conductive layer. The first pad and the second pad are arranged on respective sides of an imaginary center line along which the optical axis of the semiconductor device extends and the light-shielding conductive layer is provided at a position beneath a light emission center or a light reception center of the semiconductor device in plan view.

11 Claims, 9 Drawing Sheets

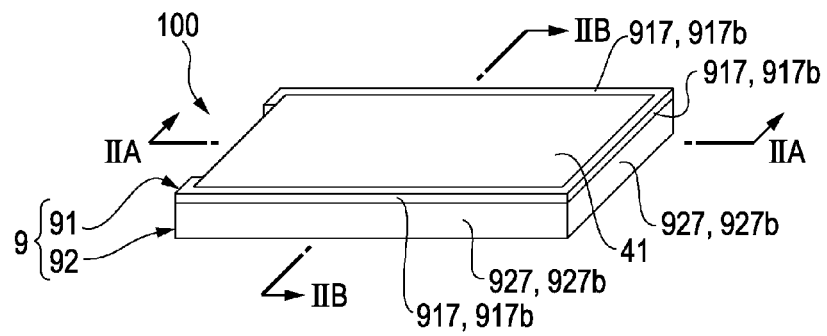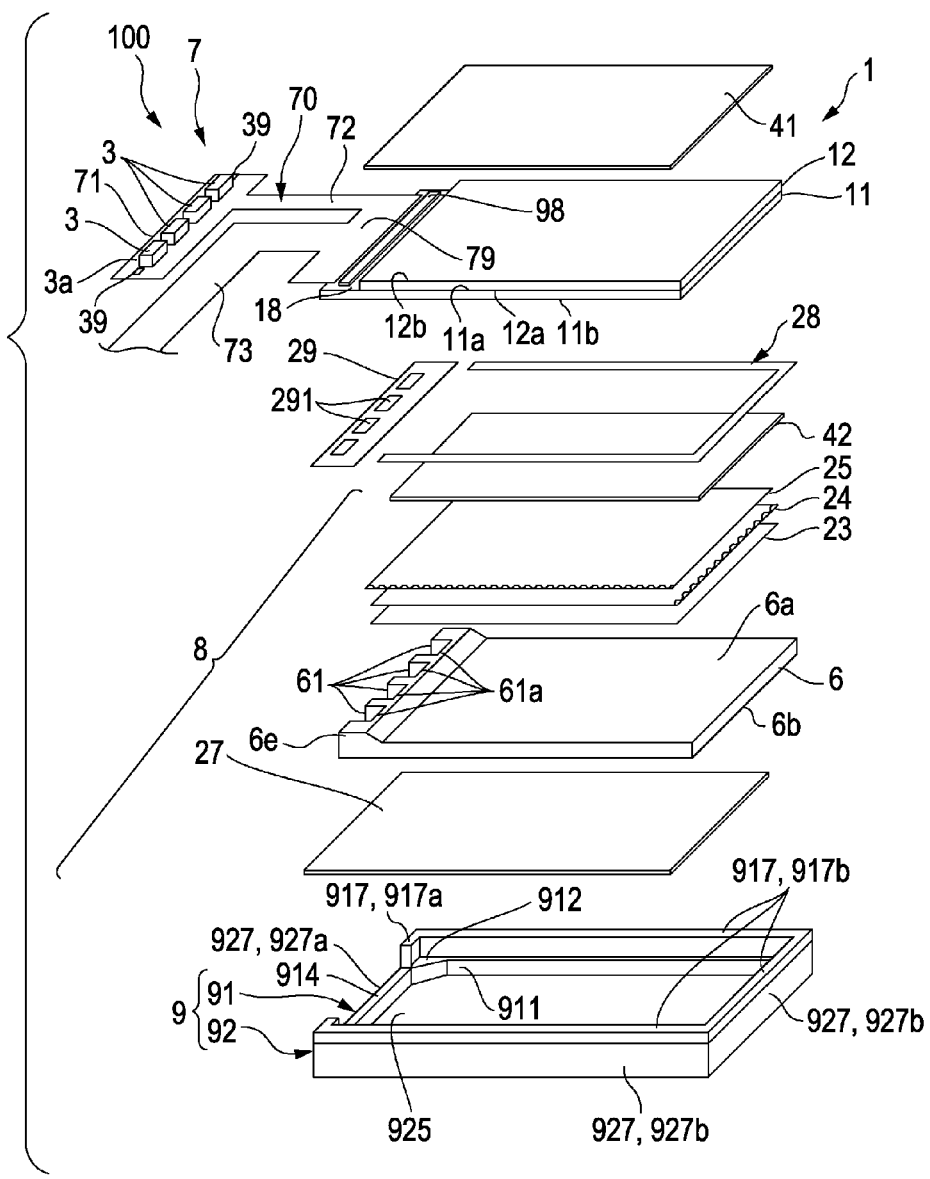

MOUNT STRUCTURE, ILLUMINATION APPARATUS AND LIQUID CRYSTAL APPARATUS

BACKGROUND

1. Technical Field

The present invention relates to a mount structure in which a semiconductor device composed of a light-emitting device or a light-receiving device is mounted on a wiring board, an illumination apparatus that includes the mount structure, and a liquid crystal apparatus that includes the illumination apparatus as a backlight apparatus.

2. Related Art

A liquid crystal apparatus of a transmissive or transflective type includes an illumination apparatus 8 disposed on a back surface side of a liquid crystal panel. In the illumination apparatus 8, a light-emitting device 3 illustrated in FIGS. 8A and 8B is used in a mount structure 7 and mounted on a first surface 71a side of a flexible wiring board 70. An optical axis L of the light-emitting device 3 is oriented in a direction extending along a board surface of the flexible wiring board 70. In a light-guide plate 6, a lateral end surface that faces a light emission center 3c of the light-emitting device 3 serves as a light incidence portion 61a and light rays incident from the light incidence portion 61a are emitted from a light emission surface 6a facing in the same direction as a second surface 71b side of the flexible wiring board 70, as illustrated by arrow L1 in FIG. 8A (refer to JP-A-2008-9038).

In the illumination apparatus 8, as illustrated in FIGS. 8B, 8C, and 8D, on the first surface 71a side of the flexible wiring board 70, a first pad 75 is formed at a position beneath a first terminal 35 of the light-emitting device 3 and a second pad 76 is formed at a position beneath a second terminal 36 of the light-emitting device 3 on the opposite side of an imaginary center line L0 with respect to the first pad 75, the imaginary center line L0 extending along the optical axis L.

However, in the flexible wiring board 70 illustrated in FIGS. 8C and 8D, there is a large region in which a conductive layer is not formed at a position beneath the light-emitting device 3 in plan view and there is only a thin base film 74 in that region. Consequently, in the mount structure 7 illustrated in FIG. 8, there is a problem in that a large amount of light leaks through the base film 74 of the flexible wiring board 70, as illustrated by arrow L2. Having said that, disposing a light-shielding member on the second surface 71b side of the flexible wiring board 70 is not preferable since the thickness of the mount structure 7 would be increased.

Here, as illustrated in FIGS. 9A, 9B, 9C and 9D, the inventors of the present application have proposed forming a first light-shielding conductive layer 77a and a second light-shielding conductive layer 77b by using the same conductive layer as the first pad 75 and the second pad 76 on either side of the imaginary center line L0 and narrowing the region in which a conductive layer is not formed in the flexible wiring board 70.

However, it was found that leakage of light illustrated by arrow L2 in FIG. 9B could also not be prevented with the mount structure 7 illustrated in FIG. 9. As various measured results of this phenomenon, it was found that not only was a light-shielding property not imparted at positions beneath the light emission center 3c of the light-emitting device 3 in plan view but also that leakage of light through the base film 74 could not be prevented.

As for this phenomenon, in the case where, instead of the light-emitting device 3, a light-receiving device is mounted such that the optical axis thereof is oriented in a direction extending along the board surface of the flexible wiring board 70, a problem arises in that, light that leaks through the base film 74 of the flexible wiring board 70 is incident on the light reception center of the light-receiving device.

SUMMARY

An advantage of some aspects of the invention is that there are provided a liquid crystal apparatus that includes a mount structure capable of preventing leakage of light through a wiring board on which a semiconductor device is mounted; an illumination apparatus that includes the mount structure; and a liquid-crystal apparatus that includes the illumination apparatus.

In order to achieve the above advantage, a mount structure according to an aspect of the invention includes a wiring board and a semiconductor device composed of a light-emitting device or a light-receiving device mounted on one surface side of the wiring board such that an optical axis thereof is oriented in a direction that extends along a board surface of the wiring board. In the mount structure according to the aspect of the invention, on the one surface side of the wiring board, a first pad on which a first terminal of the semiconductor device is mounted, a second pad on which a second terminal of the semiconductor device is mounted, and a light-shielding conductive layer are formed using the same conductive layer; the first pad and the second pad are arranged on respective sides of an imaginary center line along which the optical axis of the semiconductor device extends; and the light-shielding conductive layer is provided at a position beneath a light emission center or a light reception center of the semiconductor device in plan view.

In the aspect of the invention, on the one surface side of the wiring board, the light-shielding conductive layer is formed by using the same conductive layer as the conductive layer that forms the first pad and the second pad and the light-shielding conductive layer is formed beneath the light emission center or the light reception center of the semiconductor device in plan view. Consequently, leakage of light through the wiring board on which the semiconductor device is mounted can be prevented. For example, in the case where a light-emitting device is mounted on the wiring board as the semiconductor device, since light traveling toward the wiring board out of light emitted from the light-emitting device is blocked by the light-shielding conductive layer, leakage of light through the wiring board can be prevented. Therefore, light is only emitted from the light-emitting device in a predetermined direction. In addition, in the case where a light-receiving device is mounted on the wiring board as the semiconductor device, since light attempting to reach the light-receiving device through the wiring board is blocked by the light-shielding conductive layer, light leaking through the wiring board never reaches the light-receiving device. Therefore, only light incident from a predetermined direction is received by the light-receiving device. In addition, the light-shielding conductive layer is formed by using the same conductive layer as that which forms the first pad and the second pad on the one surface side of the wiring board. Therefore, compared with the case where the light-shielding layer is formed on the other surface side of the wiring board, the thickness of a region in which the semiconductor device is mounted on the wiring board can be reduced. Furthermore, compared with the case where a light-shielding sheet is disposed on the other surface side of the wiring board, the portion on which the semiconductor device is mounted in the mount structure can be made thin.

In the aspect of the invention, it is preferable that part of the light-shielding conductive layer protrude in a direction in which the optical axis extends from a region beneath the semiconductor device in plan view. By adopting such a configuration, leakage of light through the wiring board can also be prevented in a region that extends forward from the light emission center of the light-emitting device or the light reception center of the light-receiving device along the optical axis.

In the aspect of the invention, it is preferable that the light-shielding conductive layer also extends in a direction opposite to that in which the optical axis extends from a position beneath the light emission center or the light reception center of the semiconductor device. By adopting such a configuration, leakage of light through the wiring board can also be prevented in a region that extends rearward from the light emission center of the light-emitting device or the light reception center of the light-receiving device along the optical axis.

In the aspect of the invention, it is preferable that the light-shielding conductive layer be connected to the first pad. By adopting such a configuration, only the light-shielding conductive layer and the second pad need to be dielectrically isolated and it is not necessary to dielectrically isolate the light-shielding conductive layer and the first pad. Therefore, in the area between the first pad and the second pad, the region in which the wiring layer is not formed can be narrowed and therefore leakage of light through the wiring board can be prevented with high efficiency.

In this case, it is preferable that the light-shielding conductive layer be provided at a leading end side of a connective portion that extends from the first pad and has a smaller width than the first pad. When surface mounting the semiconductor device on the wiring board, cream solder is applied to the first pad and the second pad, the semiconductor device is mounted, and then heating is performed. At this time, in order to prevent the semiconductor device from being displaced by being pulled by the solder, the first pad and the second pad are formed so as to be symmetrical. Also in this case, when the light-shielding conductive layer is formed at a leading end side of the connective portion, which extends from the first pad and has a smaller width than the first pad, it can be ensured that the first pad and the second pad are symmetrical with each other and as a result the light-emitting device can be mounted with high accuracy.

In the aspect of the invention, it is preferable that the ground potential be applied to the first pad and the light-shielding conductive layer. When this configuration is adopted, the light-shielding conductive layer can be used as an electromagnetic shield.

In the aspect of the invention, the semiconductor device is, for example, a light-emitting device. In this case, the mount structure to which the aspect of the invention has been applied can be used in an illumination apparatus. The illumination apparatus includes a light guide plate having a light incidence portion composed of a lateral end surface that faces the light emission center of the light-emitting device and a light emission surface from which light, which was incident from the light incidence portion, is emitted in a direction that intersects the lateral end surface. When the aspect of the invention is applied to the mount structure used in the illumination apparatus, light can be prevented from leaking through the wiring board, in other words, to places outside the light guide plate, and an illumination apparatus from which light is emitted only from a predetermined region can be realized.

An illumination apparatus to which the aspect of the invention has been applied can be used in a liquid crystal apparatus and in such a case the liquid crystal apparatus is provided with a liquid crystal panel that modulates and emits light emitted from the illumination apparatus.

A liquid crystal apparatus to which the aspect of the invention has been applied can be used in electronic appliances such as mobile computers, mobile telephones, car navigation devices and personal computers.

BRIEF DESCRIPTION OF THE DRAWINGS

The invention will be described with reference to the accompanying drawings, wherein like numbers reference like elements.

FIGS. 1A and 1B are a perspective view and an exploded perspective view of a liquid crystal apparatus according to a first embodiment of the invention, respectively.

DESCRIPTION OF EXEMPLARY EMBODIMENTS

Figure 2A:
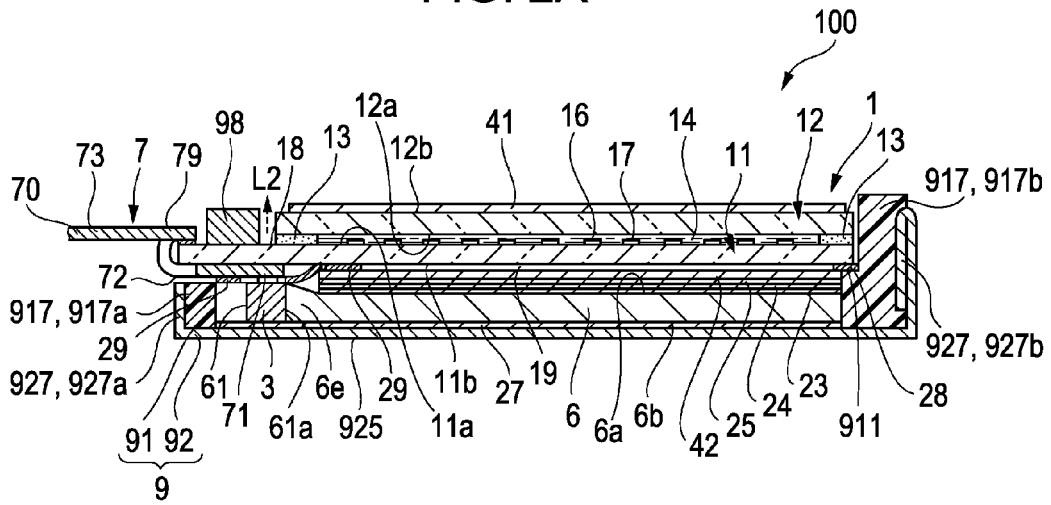
FIGS. 2A and 2B are sectional views respectively taken along lines IIA-IIA and IIB-IIB in FIG. 1 that schematically illustrate the liquid crystal apparatus according to the first embodiment.

Embodiments of the invention will now be described with reference to the drawings. In the drawings referred to in the following description, since individual layers and components have been made to be of a recognizable size, the individual layers and components have been reduced by different amounts. Furthermore, in the following description, for ease of understanding of the correspondence between the structures described with reference to FIGS. 8 and 9, like components are denoted by like reference numerals.

First Embodiment

Entire Structure of Liquid Crystal Apparatus

Figure 2B:
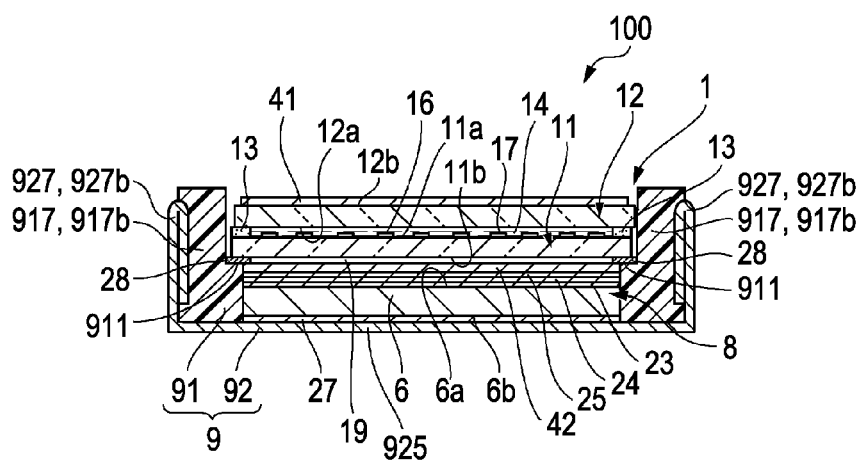

FIGS. 1A and 1B are a perspective view and an exploded perspective view of a liquid crystal apparatus according to a first embodiment of the invention, respectively. FIGS. 2A and 2B are schematic sectional views of the liquid crystal apparatus according to the first embodiment of the invention taken along lines IIA-IIA and IIB-IIB of FIG. 1A, respectively.

As illustrated in FIGS. 1A, 1B, 2A and 2B, a liquid crystal apparatus 100 of the first embodiment includes a liquid crystal panel 1 of a transmissive or transflective type and an illumination apparatus 8 (backlight) arranged on a back surface side of the liquid crystal panel 1. The illumination apparatus 8 and the liquid crystal panel 1 are held inside a frame 9, which is flat and has a rectangular shape.

The frame 9 is composed of a resin frame 91 having a rectangular frame-like shape and a metal frame 92 having a box-like shape and supporting the resin frame 91 around the exterior thereof. The resin frame 91 and the metal frame 92 are each formed in one piece by insert molding or outsert molding. With this configuration, even though the frame 9 is made to have a low profile, it can still be ensured that the frame 9 has high strength since the metal frame 92 is used. Furthermore, the resin frame 91 functions as cushion for the liquid crystal panel 1, and therefore the liquid crystal panel 1 can be prevented from being damaged.

The resin frame 91 includes four side walls 917. A cutout portion 914 is formed in one side wall 917a positioned on the flexible wiring board 70 side and a step portion 911 that receives the liquid crystal panel 1 on an upper surface thereof is formed on the inside (inner periphery of the frame 9) of the three remaining side walls 917b, among the four side walls 917.

The metal frame 92 includes a rectangular base plate 925 and four side plates 927 that stand on the periphery of the base plate 925. Among the four side plates 927 in the metal frame 92, one side plate 927a positioned on the flexible wiring board 70 side has a comparatively lower height than the side plates 927b positioned on the other edges.

In the frame 9, the resin frame 91 is formed so as to cover the inner sides of the metal frame 92. Therefore, the inner surfaces of the side plates 927 of the metal frame 92 are covered by the side walls 917 of the resin frame 91, but the outer surfaces of the side plates 927 are not covered by the resin frame 91. Accordingly, the outer surfaces of the side plates 927 of the metal frame 92 are in an exposed state. Furthermore, a base plate is not formed in the resin frame 91. Consequently, both the upper surface (internal surface) and the lower surface (external surface) of the base plate 925 of the metal frame 92 are not covered by the resin frame 91 and are in an exposed state. However, triangular portions 912 that are connected to the step portion 911 are formed in the corners between the side wall 917a and the side walls 917b and the triangular portions 912 partially cover the upper surface (one side of the surface) of the base plate 925 of the metal frame 92.

The side plates 927b are structured such that an edge of the metal plate thereof is folded over on itself in the downward direction and the side plates 927b come to be formed of two layers of metal plate. Consequently, even though the metal frame 92 is formed from a thin metal plate, the side plates 927b have high strength. The folded-over structure of the side plates 927b can be formed by using a hemming process. Here, either of a structure in which the two layers of metal plate closely contact each other and a structure in which the two layers of metal plate face each other with a gap therebetween may be adopted for the side plates 927b. In the present embodiment, a gap is provided between the two layers of metal plate and resin that forms the resin frame 91 is filled into the gap. Therefore, the portion into which the resin is filled into the gap between the two layers of metal plate forming the side plates 927b solidly connects the side walls 917b and the side plates 927b.

The liquid crystal panel 1 includes a device substrate 11 and a counter substrate 12, which is arranged opposite a first surface 11a (one surface) of the device substrate 11, and a sealing member 13 that has a rectangular frame-like shape and bonds the device substrate 11 and the counter substrate 12 to each other around peripheral portions of the substrates. The liquid crystal panel 1 contains a liquid crystal layer 14 that is held in the space formed between the device substrate 11, the counter substrate 12 and the sealing member 13. The device substrate 11 includes a protruding region 18 that protrudes beyond the end of the counter substrate 12. In this embodiment, the device substrate 11 and the counter substrate 12 are both optically transparent insulating substrates such as glass substrates.

On the first surface 11a of the device substrate 11 facing the counter substrate 12, pixel electrodes 16 composed of island-shaped indium tin oxide (ITO) films or indium zinc oxide (IZO) films, pixel switching devices, and signal lines (not illustrated) such as scanning lines and data lines, and the like, are formed, and an alignment film (not illustrated) composed of polyimide is formed so as to cover the pixel electrodes 16. In the present embodiment, the liquid crystal panel 1 is an in-plane switching (IPS) mode or fringe-field switching (FFS) mode liquid crystal panel and the liquid crystal layer 14 is driven by using a transverse electric field. Therefore, common electrodes 17 composed of ITO or IZO films are also formed on the device substrate 11. Consequently, the common electrodes 17 are not formed on the first surface 12a of the counter substrate 12 facing the device substrate 11. In the case of an IPS mode liquid crystal panel, a configuration is adopted in which the pixel electrodes 16 and the common electrodes 17 are aligned with the transverse direction and in the case of an FFS mode liquid crystal panel, a configuration is adopted in which the pixels electrodes 16 and the common electrodes 17 are formed in layers at different heights and sandwich a dielectric film therebetween. However, in, for example, FIGS. 2A and 2B, the pixel electrodes 16 and the common electrodes 17 are also schematically illustrated as being aligned with the transverse direction the FFS mode, as for the IPS mode. Sometimes color filters (not illustrated) are also formed on the first surface 12a of the counter substrate 12. In addition, sometimes the liquid crystal panel 1 is configured as a twisted nematic (TN) mode, an electrically controlled birefringence (ECB) mode or a vertically aligned nematic (VAB) mode liquid crystal panel, and in such a case the pixel electrodes 16 are formed on the device substrate 11 and the common electrodes 17 are formed on the counter substrate 12.

In the liquid crystal panel 1, an upper polarizing plate 41 is disposed on a second surface 12b of the counter substrate 12, the second surface 12b being on the opposite side to the first surface 12a that faces the device substrate 11. A plurality of optical sheets (optical components) including a lower polarizing plate 42 are arranged on a second surface 11b side of the device substrate 11, the second surface 11b being opposite the first surface 11a that faces the counter substrate 12. In the liquid crystal apparatus 100 having such a configuration, light emitted from the illumination apparatus 8 is incident from the device substrate 11 side, the incident light is subjected to optical modulation and is emitted from the counter substrate 12 side and an image is displayed.

As illustrated in FIG. 1B and FIG. 2A, a driving IC 98 is mounted in the protruding region 18 of the device substrate 11 by using an anisotropic conductive film or the like and the flexible wiring board 70, which is composed of a multilayer board or a two-sided board, is connected to an end of the protruding region 18. Consequently, various signals and a power supply voltage supplied from the outside can be input to the liquid crystal panel 1 via the flexible wiring board 70.

Entire Structure of Illumination Apparatus 8

Figure 3:
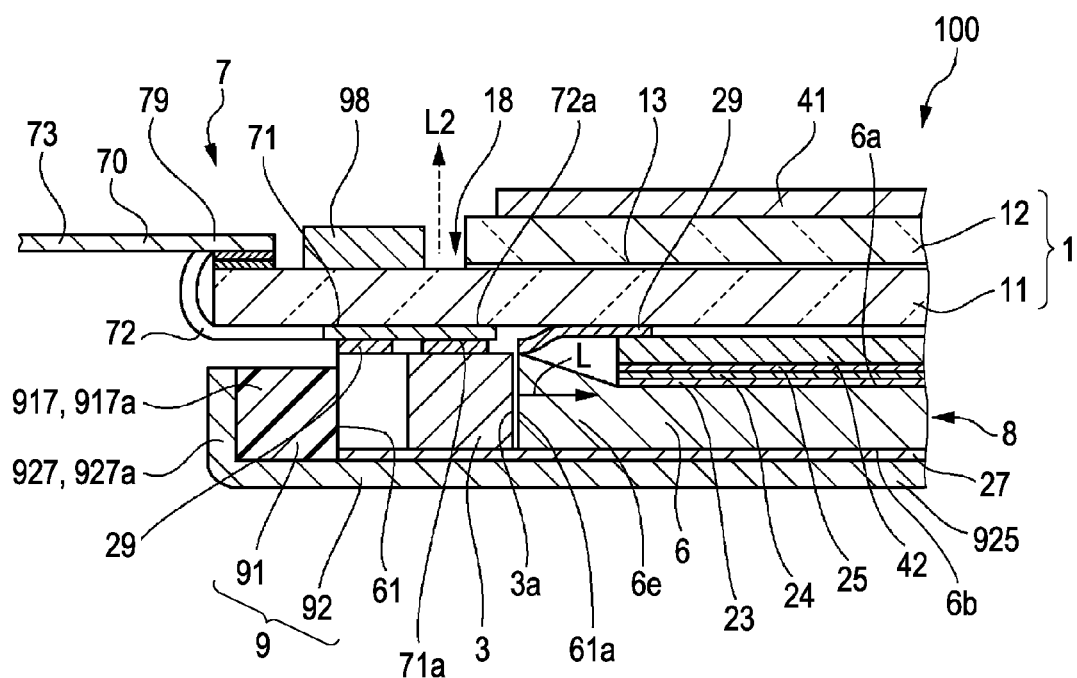
FIG. 3 is an enlarged sectional view illustrating the structure of the flexible-wiring-board end of the liquid crystal apparatus according to the first embodiment of the invention illustrated in FIG. 1A.

FIG. 3 an enlarged sectional view illustrating the structure of the flexible wiring board 70 end of the liquid crystal apparatus 100 according to the first embodiment of the invention illustrated in FIG. 1A.

As illustrated in FIGS. 1A, 1B, 2A and 3, a strip-shaped portion 72 having a small width and an external connection portion 73 having a large width extend from a main portion 79 of the flexible wiring board 70 and a light-source-mounting portion 71 whose longitudinal axis is oriented parallel to the lateral axis of the liquid crystal panel 1 is formed on a leading end of the strip-shaped portion 72. The external connection portion 73 provides a connection with the main body side of an appliance equipped with the liquid crystal apparatus 100.

A plurality of light-emitting devices 3 are mounted at predetermined intervals on a first surface 71a of the light-source-mounting portion 71 as light sources of the illumination apparatus 8 and a light source driving voltage is supplied to the light-emitting devices 3 through the flexible wiring board 70. On the flexible wiring board 70, electronic components 39, such as surface mount capacitors, are also mounted on the first surface 71a on which the light-emitting devices 3 are mounted.

Thus, in the present embodiment, the light-emitting devices 3 are used in the mount structure 7 and mounted on the flexible wiring board 70. In the mount structure 7, the light-emitting devices 3 are white surface mount light-emitting diodes (LEDs/semiconductor devices) and light emission centers 3a thereof are oriented in a direction extending along the first surface 71a of the light-source-mounting portion 71. Therefore, each of the light-emitting devices 3 has its optical axis L oriented in a direction parallel to the first surface 71a of the light-source-mounting portion 71 of the flexible wiring board 70.

The illumination apparatus 8 includes a substantially rectangular light guide plate 6 (optical component) whose light emission surface 6a faces the device substrate 11 of the liquid crystal panel 1 and the plurality of light-emitting devices 3 composed of white LEDs arranged along a lateral end 6e of the light guide plate 6. Furthermore, the illumination apparatus 8 includes a reflective sheet 27 (optical component) disposed on a back surface 6b of the light guide plate 6 on the opposite side to the light emission surface 6a. In addition, on the light emission surface 6a side of the light guide plate 6. In addition, the illumination apparatus 8 includes a rectangular dispersion plate 23, a rectangular prism sheet 24 and a rectangular prism sheet 25 as optical sheets (optical components). The light guide plate 6 is a component for performing uniform in-plane irradiation of the liquid crystal panel 1 with light emitted from the light-emitting devices 3, and is composed of an optically transparent material such as acrylic resin, or polycarbonate. The dispersion plate 23 is a component for making the luminance of light within a display screen more uniform. The prism sheets 24 and 25 are components for adjusting the orientation angle of emitted light and improving the luminance in the forward direction.

Light source arrangement holes 61 are each formed in a cut-out shape at predetermined intervals along the edge of the lateral end 6e of the light guide plate 6 and a lateral end surface of the light guide plate 6 corresponding to inner walls of light source arrangement holes 61 forms light incidence portions 61a to which light emitted from the light-emitting devices 3 is incident. Therefore, when the strip-shaped portion 72 is bent over such that the first surface 71a, on which the light-emitting devices 3 of the light-source-mounting portion 71 are mounted, faces downward and the light-source-mounting portion 71 is stacked on the lateral end of the light guide plate 6, the light emission center 3a of each of the plurality of light-emitting devices 3 points toward the corresponding light incidence portion 61a and is arranged in the corresponding light source arrangement hole 61. In order to maintain the above arrangement, a light-shielding film 29, on both sides of which an adhesive layer is formed, is affixed along the lateral end 6e of the light guide plate 6. Rectangular openings 291 are formed at positions above the light source arrangement holes 61 of the light guide plate 6 in plan view in the light-shielding sheet 29. Therefore, when the light-source-mounting portion 71 of the flexible wiring board 70 is stacked on the light-shielding sheet 29, the plurality of light-emitting devices 3 are arranged in the respective light source arrangement holes 61 through the openings 291.

Structure for Fixing Liquid Crystal Panel 1 to Frame 9

As illustrated in FIGS. 1B, 2A and 2B, when the liquid crystal panel 1 is fixed inside the frame 9, together with the outer periphery of the back surface side of the liquid crystal panel 1 being supported by the step portion 911 formed on the side walls 917 of the resin frame 917, double-sided tape 28 is disposed between the step portion 911 and the liquid crystal panel 1.

The double-sided tape 28 includes an adhesive layer on both sides of the film base material. Consequently, together with the top surface of the double-sided tape 28 adhering to the liquid crystal panel 1, the back surface side of the double-sided tape 28 adheres to the step portion 911 of the frame 9. Therefore, in the present embodiment, the lower polarizing plate 42 is formed to be of a size that fits within the inner periphery of the step portion 911 and the lower polarizing plate 42 is disposed on the back surface side of the liquid crystal panel 1 and inside the step portion 911, similarly to the reflective sheet 27, the wave guide plate 6, the dispersion plate 23 and the prism sheets 24 and 25. In this state, the front surface of the lower polarizing plate 42 is positioned at approximately the same height as the step portion 911, for example. Thus, a gap 19, which corresponds to the thickness of the double-sided tape 28, is formed between the liquid crystal panel 1 and the lower polarizing plate 42 and the gap 19 is a layer of air. Sometimes an optically transparent material is filled into the gap 19. The double-sided tape is light-shielding tape having a thickness of 50-60 μm. The lower surface of the double-sided tape 28 is a white- or silver-colored reflective surface, whereas the upper surface of the double-sided tape 28 is a black-colored light-absorbing surface.

Here, the double-sided tape 28 has a larger width than the step portion 911 and the double-sided tape 28 includes a protruding portion that protrudes out into the interior of the frame 9 from the step portion 911. The front surface side of the protruding portion of the double-sided tape 28 adheres to the back surface of the liquid crystal panel 1 and the back surface of the protruding portion adheres to edges of the front surface side of the lower polarizing plate 42. With this configuration, the liquid crystal panel 1 and the step portion 911 of the frame 9 are directly adhered to each other through the double-sided tape 28, rather than being adhered to each other with an optical sheet such as the lower polarizing plate interposed therebetween. Therefore, along with reduction of the size of the liquid crystal panel 1 and reduction of the width of the casing, even when the non-display region and the lower polarizing plate 42 are of a small size, there is an advantage in that, for example, the region in which the liquid crystal panel 1 and the double-sided tape 28 are adhered to each other does not become narrow.

Furthermore, instead of the above configuration, the lower polarizing plate 42 may be adhered to the back surface of the liquid crystal panel 1 with an adhesive and the double-sided tape 28 may be disposed between the outer periphery of the back surface side of the lower polarizing plate 42 and the step portion 911. When this configuration is adopted, the liquid crystal panel 1 can be fixed to the step portion 911 with the lower polarizing plate 42 therebetween. Furthermore, sometimes the same component is used as the double-sided tape 28 and the light-shielding sheet 29.

Detailed Configuration of Mount Structure

FIG. 4 are explanatory views of the mount structure 7 according to the first embodiment of the invention. FIG. 4A is an explanatory view of the mount structure 7 in a direction from the side of the light-emitting device 3, FIG. 4B is an explanatory view of the mount structure 7 from the side of the light-emitting portion of the light-emitting device 3, FIG. 4C is a plan view illustrating in plan view the structure of the conductive layer formed in light-source-mounting portion 71 of the flexible wiring board 70 used in the mount structure 7, and FIG. 4D is a plan view of a state in which the light-emitting device 3 has been mounted on the light-source-mounting portion 71. FIG. 4B corresponds to the cross section IVB-IVB of FIG. 4D. In FIGS. 4A and 4B, the first surface 71a of the flexible wiring board 70 is shown on the upper side and the second surface 71b is shown on the lower side, opposite to how they are shown in FIGS. 2 and 3.

Figure 4A:
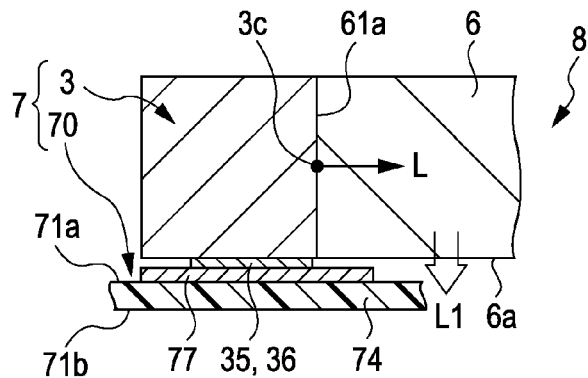
FIG. 4 are explanatory views of a mount structure according to the first embodiment of the invention.
Figure 4B:
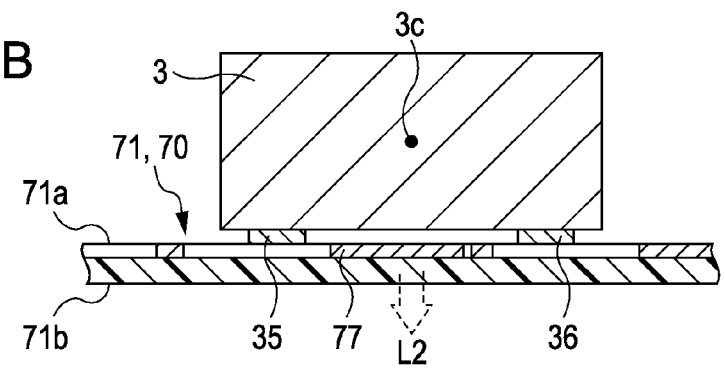

As illustrated in FIGS. 4A and 4B, in the mount structure 7 used in the liquid crystal apparatus 100 and illumination apparatus 8 of this embodiment, the light-emitting device 3 is mounted on the first surface 71 side of the flexible wiring board 70 such that the optical axis L thereof is oriented in a direction parallel to the board surface of the flexible wiring board 70 serving as a wiring board. Furthermore, a lateral end surface of the light guide plate 6 facing the light emission center 3c serves as the light incidence portion 61a and light incident from the light incidence portion 61a is emitted from the light emission surface 6a facing in the same direction as the second surface 71b of the flexible wiring board 70, as illustrated by arrow L1 in FIG. 4A.

Figure 4C:
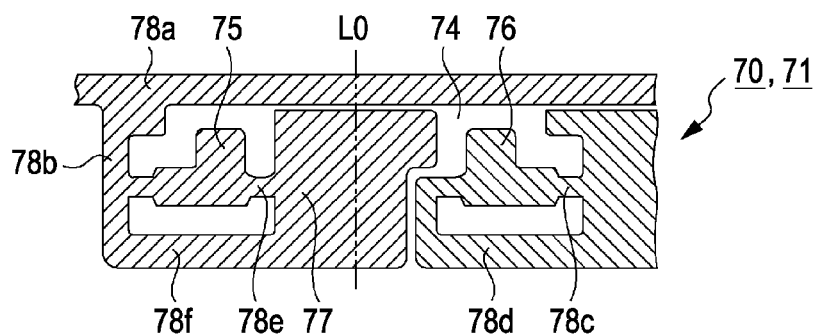
Figure 4D:
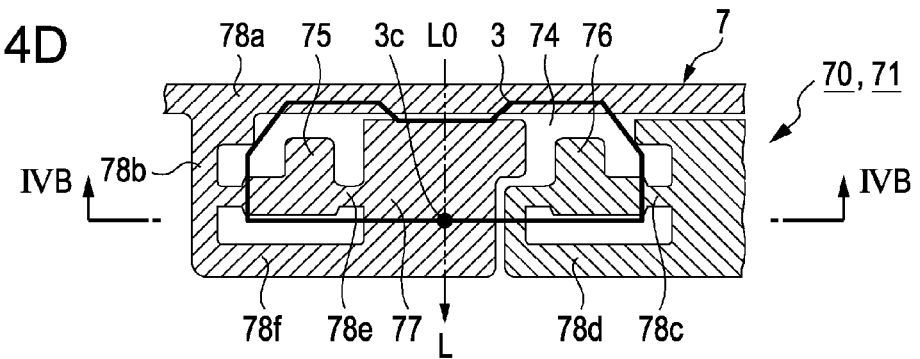

As illustrated in FIGS. 4B, 4C and 4D, a first pad 75 is formed at a position beneath a first terminal 35 of the light-emitting device 3 by using a conductive layer such as a copper layer on one surface of a base film 74 composed of polyimide or the like on the first surface 71a side of the flexible wiring board 70 and a second pad 76 is formed at a position beneath a second terminal 36 of the light-emitting device 3 on the opposite side of a imaginary center line L0 with respect to the first pad 75 along which the optical axis L extends. The first pad 75 is for applying a ground potential and the second pad 76 is for applying a driving potential. The base film 74 has a thickness on the order of 25-35 μm and the thickness of the conductive layer (copper layer) constituting the first pad 75 and the second pad 76 is on the order of 25 μm.

In addition, a ground wiring layer 78a is formed and wiring layers 78b, 78c, 78d and 78f are formed for the first pad 75 and the second pad 76 by using the same conductive layer as the first pad 75 and the second pad 76 on the first surface 71a side of the light-source-mounting portion 71 of the flexible wiring board 70. The ground wiring layer 78a and the wiring layers 78b, 78c, 78d and 78f are covered by a front surface protective layer formed of polyimide or the like, which is not illustrated in the figures.

On the flexible wiring board 70 structured in this way, the first pad 75 and the wiring layers 78b and 78f are respectively approximately axisymmetrically formed with respect to the second pad 76 and the wiring layers 78c and 78d about the virtual center line L0 therebetween along which the optical axis L extends.

In the mount structure 7, if the light emitted from the light-emitting device 3 leaks through the base film 74 in an area in which the conductive layer is not formed in the flexible wiring board 70, as illustrated by arrow L2 in FIGS. 2A, 3 and 4B, as a result of the leaked light being emitted from the side of the liquid crystal panel 1, the quality of the liquid crystal apparatus 100 is reduced.

Therefore, in the mount structure 7 of this embodiment, a light-shielding conductive layer 77 having an approximately rectangular planar shape is formed by using the same conductive layer (copper layer) as the first pad 75 and the second pad 76 on the first surface 71a side of the flexible wiring board 70 and the light-shielding conductive layer 77 is disposed beneath the light emission center 3c of the light-emitting device 3 in plan view.

In this embodiment, part of the light-shielding conductive layer 77 protrudes in the direction in which the optical axis L extends from a region disposed beneath the light emission center 3c of the light-emitting device 3 in_plan view. In addition, the light-shielding conductive layer also extends in the opposite direction to the direction in which the optical axis L extends from a position beneath the light emission center 3c of the light-emitting device 3 in plan view.

Here, the light-shielding conductive layer 77 is connected to the first pad 75 and the ground potential is applied thereto, similarly to the first pad 75. In this embodiment, when the light-shielding conductive layer 77 and the first pad 75 are connected to each other, the light-shielding conductive layer 77 is formed by extending a middle portion of the wiring layer 78f connected to the first pad 75. Therefore, the light-shielding conductive layer 77 is formed at a leading end side of a connective portion 78e that extends from the first pad 75 and has a smaller width than the first pad 75. The light-shielding conductive layer 77 and the connective portion 78e are also covered by the front surface protective layer composed of polyimide or the like (not illustrated).

In the mount structure 7, even in the case where there is leakage of light from the light-emitting device 3 to the side where the base plate 925 (refer to FIGS. 2 and 3) of the metal frame 92 is positioned, since the light is only directed toward the reflective sheet 27, the quality of the liquid crystal apparatus 100 is not reduced.

Operation and Main Advantage of this Embodiment

As has been described above, in the mount structure 7, the illumination apparatus 8 and the liquid crystal apparatus 100 of this embodiment, the light-shielding conductive layer 77 is formed by using the same conductive layer as the conductive layer that forms the first pad 75 and the second pad 76 on the first surface 71a side of the flexible wiring board 70 and the light-shielding conductive layer 77 is formed beneath the light emission center 3c of the light-emitting device 3 in plan view. Consequently, when the light-emitting device 3 is mounted on the flexible wiring board 70 such that the optical axis L thereof is oriented parallel to the board surface, since light directed toward the flexible wiring board 70 out of light emitted from the light-emitting device 3 is blocked by the light-shielding conductive layer 77, light can be prevented from leaking through the flexible wiring board 70. Therefore, even when a light-shielding sheet or the like is not stacked on the second surface 71b side of the flexible wiring board 70, since light never leaks through the flexible wiring board 70 to the liquid crystal panel 1, the liquid crystal apparatus 100 can be designed to be of reduced thickness. Furthermore, the light-shielding conductive layer 77 is formed on the first surface 71a side of the flexible wiring board 70 by using the same conductive layer as that which forms the first pad 75 and the second pad 76. Therefore, as compared with the case where a light-shielding conductive layer is formed on the second surface 71b side of the flexible wiring board 70, the thickness of the region (light-source-mounting portion 71) in which the light-emitting devices 3 are mounted on the flexible wiring board 70 can be reduced. In addition, as compared with the case where a light-shielding sheet is disposed on the second surface 71b side of the flexible wiring board 70, a part on which the light-emitting devices 3 are mounted in the mount structure 7 can be made thin and the liquid crystal apparatus 100 can be designed to be of reduced thickness.

Moreover, part of the light-shielding conductive layer 77 protrudes in a direction in which the optical axis L extends from a region beneath the light emission center 3c of the light-emitting device 3 in plan view, whereby light can also be prevented from leaking through the flexible wiring board 70 in a region that extends forward from the light emission center 3c of the light-emitting device 3 along the optical axis L. Furthermore, since the light-shielding conductive layer 77 also extends in a direction opposite to the direction in which the optical axis L extends from a position beneath the light emission center 3c of the light-emitting device 3 in plan view, light can also be prevented from leaking through the flexible wiring board 70 in a region that extends backward from the light emission center 3c of the light-emitting device 3 along the optical axis L.

Furthermore, the light-shielding conductive layer 77 is connected to the first pad 75. Consequently, only the light-shielding conductive layer 77 and the second pad 76 need to be dielectrically isolated from each other and it is not necessary to dielectrically isolate the light-shielding conductive layer 77 and the first pad 75 from each other. Therefore, the region in which the wiring layer is not formed between the first pad 75 and the second pad 76 can be made narrow and therefore leakage of light through the flexible wiring board 70 can be prevented with high efficiency.

Moreover, the light-shielding conductive layer 77 is connected to the first pad 75 to which the ground potential is applied. Therefore, in the case in which a method is adopted in which the light-emitting device 3 is driven by using a driving signal of a predetermined frequency, the light-shielding conductive layer 77 can be used as an electromagnetic shield.

In addition, when the light-shielding conductive layer 77 and the first pad 75 are connected to each other, the light-shielding conductive layer 77 is formed at a leading end side of the connective portion 78e, which extends from the first pad 75 and has a smaller width than the first pad 75. When surface mounting the light-emitting device 3 on the flexible wiring board 70, cream solder is applied to the first pad 75 and the second pad 76, the light-emitting device 3 is mounted, and then heating is performed. At this time, in order to prevent the light-emitting device from being displaced by being pulled by the solder, the first pad 75 and the second pad 76 are formed so as to be symmetrical. Also in this case, provided that the light-shielding conductive layer 77 is structured so as to be formed at a leading end side of the connective portion 78e, which extends from the first pad 75 and has a smaller width than the first pad 75, it can be ensured that the first pad 75 and the second pad 76 are symmetrical with each other and therefore the light-emitting device 3 can be mounted with high accuracy.

When the light-emitting device 3 is driven using a fixed potential or current, the light-shielding conductive layer 77 may be connected to the second pad 76 to which the driving potential is applied.

Second Embodiment

FIG. 5 are explanatory views of the mount structure 7 according to a second embodiment of the invention. FIG. 5A is an explanatory view of the mount structure 7 from the side of the light-emitting device 3, FIG. 5B is an explanatory view of the mount structure 7 from the side of the light-emitting portion of the light-emitting device 3, FIG. 5C is a plan view illustrating in plan view the structure of the conductive layer formed in the light-source-mounting portion 71 of the flexible wiring board 70 used in the mount structure 7, and FIG. 5D is a plan view of a state in which the light-emitting device 3 has been mounted on the light-source-mounting portion 71. FIG. 5B corresponds to a cross section VB-VB of FIG. 5D. The basic structure of this embodiment is the same as that of the first embodiment and therefore portions common to both embodiments will be denoted by the same reference numerals and repeated description thereof will be omitted.

Figure 5A:
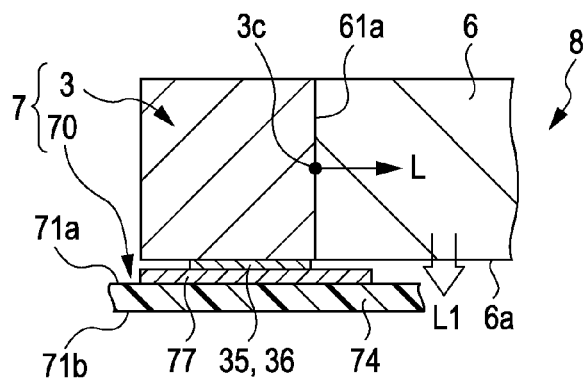
FIG. 5 are explanatory views of a mount structure according to a second embodiment of the invention.
Figure 5B:
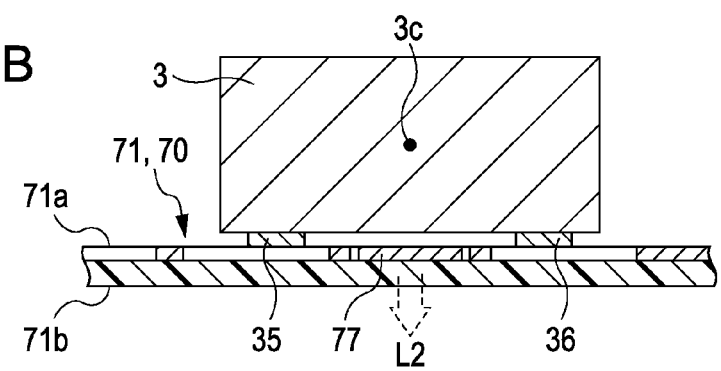
Figure 5C:
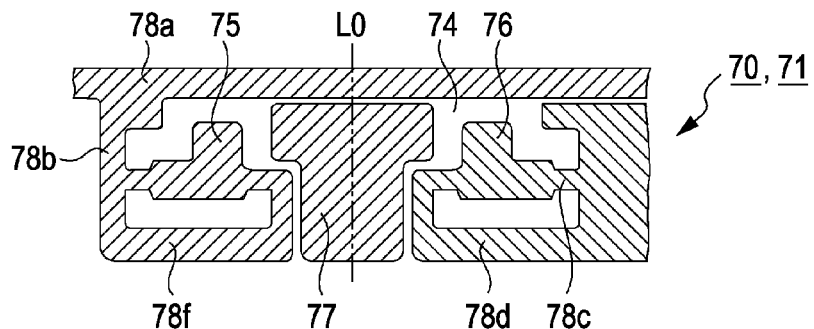
Figure 5D:
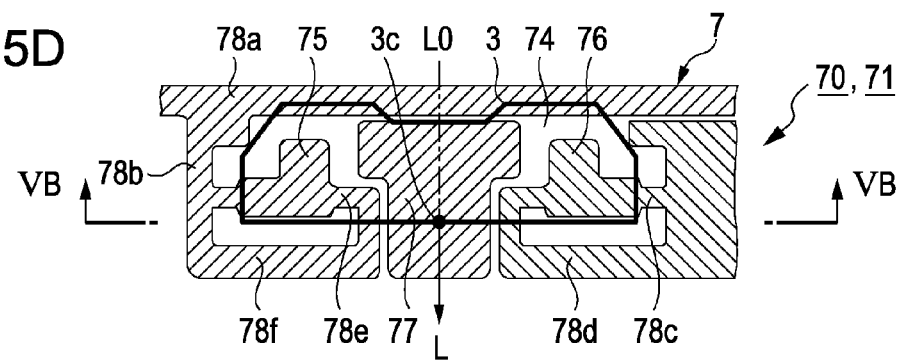
Figure 6A:
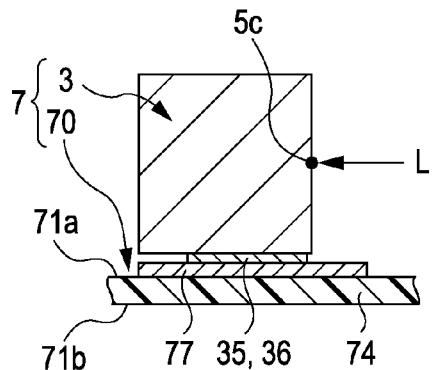
FIG. 6 are explanatory views of a mount structure according to a third embodiment of the invention.
Figure 6B:
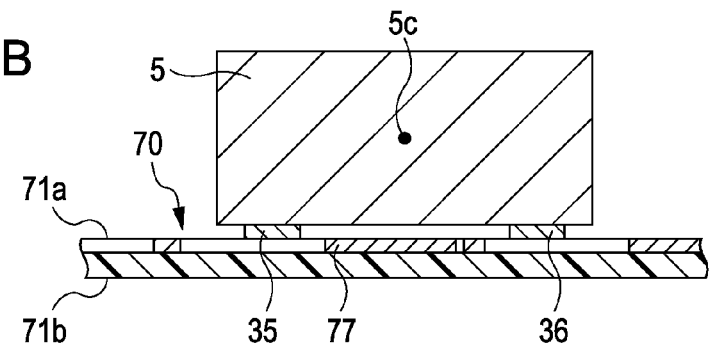
Figure 6C:
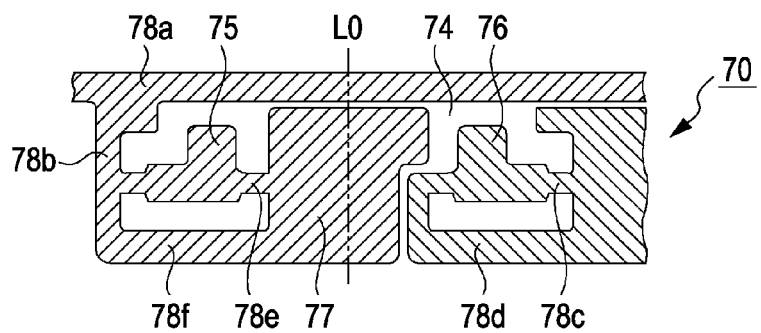
Figure 6D:
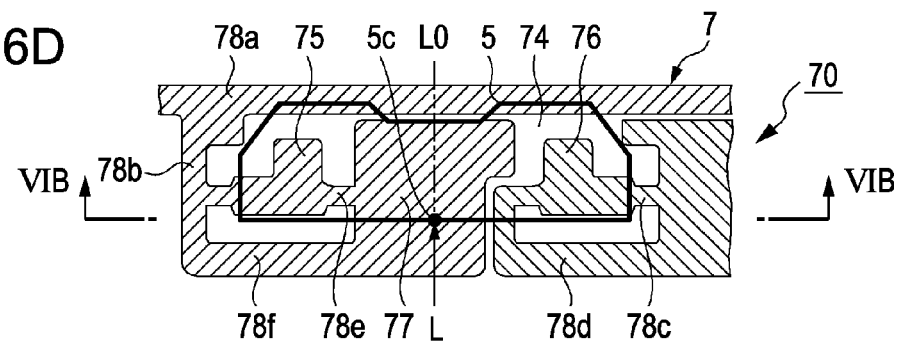

As illustrated in FIGS. 5A and 5B, in this embodiment, the light-emitting device 3 is also mounted on the first surface 71a side of the flexible wiring board 70 such that the optical axis L thereof extends along the board surface of the flexible wiring board 70, as in the first embodiment. Furthermore, the light-shielding conductive layer 77 is formed on the first surface 71a side of the flexible wiring board 70 by using the same conductive layer as that which forms the first pad 75 and the second pad 76 and the light-shielding conductive layer 77 is formed beneath the light emission center 3c of the light-emitting device 3 in plan view.

In the above-described first embodiment, when the light-shielding conductive layer 77 is formed, the light-shielding conductive layer 77 and the first pad 75 are connected to each other, but in this embodiment the light-shielding conductive layer 77 is not connected to either the first pad 75 or the second pad 76. Also with this configuration, light traveling toward the flexible wiring board 70, out of light emitted from the light-emitting device 3, is blocked by the light-shielding conductive layer 77 and thereby light can be prevented from leaking through the flexible wiring board 70 and the like, and the same advantage as in the first embodiment is achieved.

Third Embodiment

FIG. 6 are explanatory views of the mount structure 7 according to a third embodiment of the invention. FIG. 6A is an explanatory view of the mount structure 7 from the side of a light-receiving device, FIG. 6B is an explanatory view of the mount structure 7 from the side of the light-receiving portion of the light-receiving device, FIG. 6C is a plan view illustrating in plan view the structure of the conductive layer formed in the flexible wiring board 70 used in the mount structure 7, and FIG. 6D is a plan view of a state in which the light-receiving device has been mounted on the flexible wiring board 70. FIG. 6B corresponds to a cross section VIB-VIB of 6D. The basic structure of this embodiment is the same as that of the first and second embodiments and therefore portions common to the embodiments will be denoted by the same reference numbers and repeated description thereof will be omitted.

The above-described first and second embodiments have been described as examples in which a mode of the invention is applied to a mount structure 7 in which the light-emitting device 3 is mounted on the flexible wiring board 70. However, as illustrated in FIGS. 6A, 6B, 6C and 6D, a mode of the invention may be applied to a mount structure 7 in which a light-receiving device 5 (semiconductor device) such as a photodiode (PD) is mounted on the flexible wiring board 70. In other words, in the mount structure 7 of this embodiment, the light-receiving device 5 is mounted on the first surface 71a side of the flexible wiring board 70 such that optical axis L thereof is oriented in a direction that extends along the board surface of the flexible wiring board 70. In addition, the first pad 75 and the second pad 76 for mounting the light-receiving device 5 are formed on the first surface 71a side of the flexible wiring board 70. Also in the mount structure 7 of this embodiment, as in the first and second embodiments, the light-shielding conductive layer 77 is formed on the first surface 71a side of the flexible wiring board 70 by using the same conductive layer as that which forms the first pad 75 and the second pad 76 and the light-shielding conductive layer 77 is formed beneath a light reception center 5c of the light-receiving device 5 in plan view.

In the mount structure 7, light that attempts to reach the light-receiving device 5 through the flexible wiring board 70 out of light traveling toward the light-receiving device 5 is blocked by the light-shielding conductive layer 77 and therefore light leaking through the flexible wiring board 70 never reaches the light-receiving device 5. Therefore, only light incident from a predetermined direction can be received by the light-receiving device 5.

Other Embodiments

The above-described embodiments have been described as examples in which the flexible wiring board 70 is used as a wiring board in the mount structure 7, but a mode of the invention may be applied to a mount structure 7 in which a rigid wiring board is used instead of the flexible wiring board 70.

Examples of Electronic Appliances that can be Equipped with the Liquid Crystal Apparatus 100

Figure 7A:
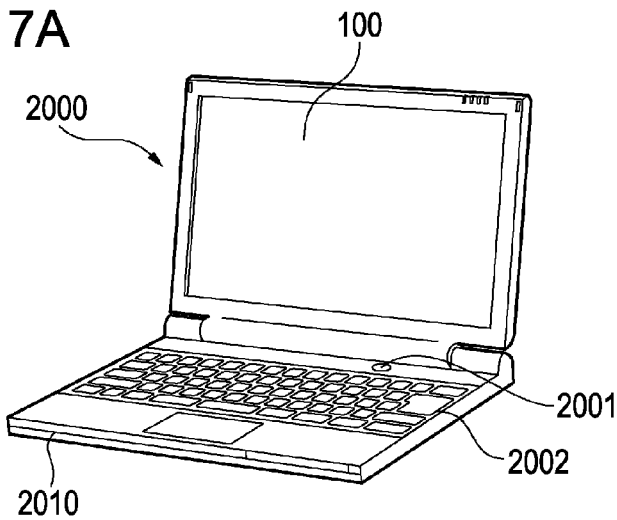
FIG. 7 are explanatory views of electronic appliances that use the liquid crystal apparatus according to an embodiment of the invention.
Figure 7B:
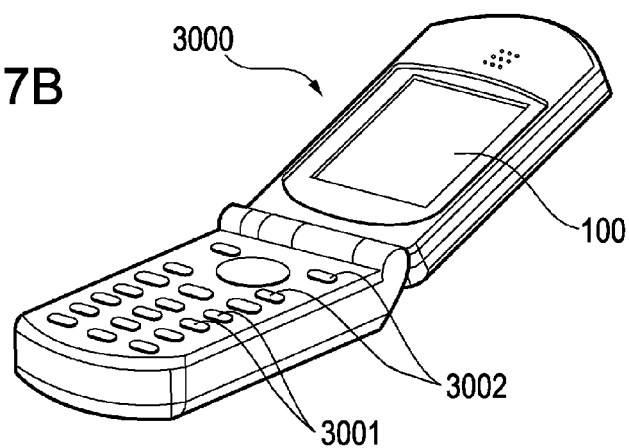
Figure 7C:
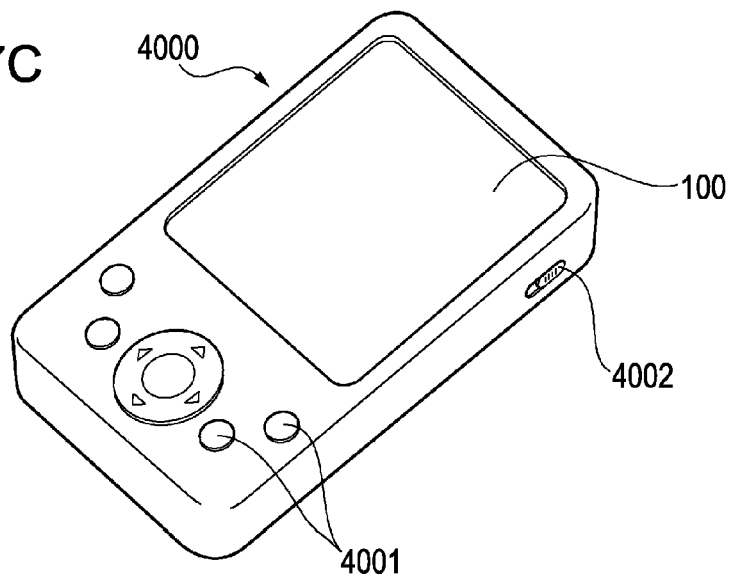
Figure 8A:
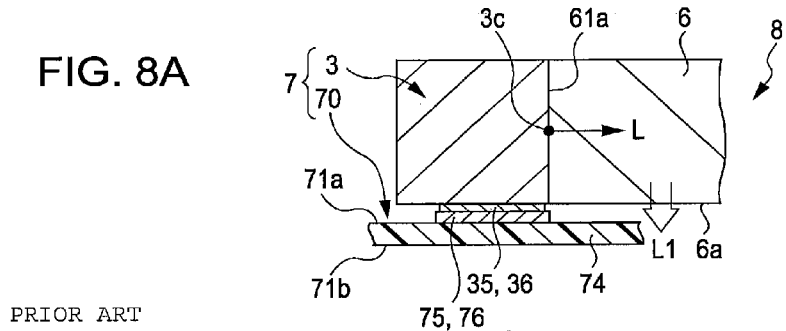
FIG. 8 are explanatory views of a mount structure of the related art.
Figure 8B:
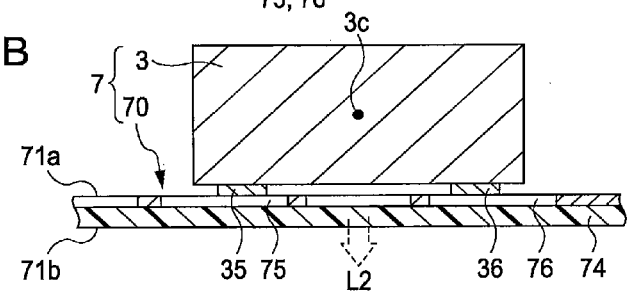
Figure 8C:
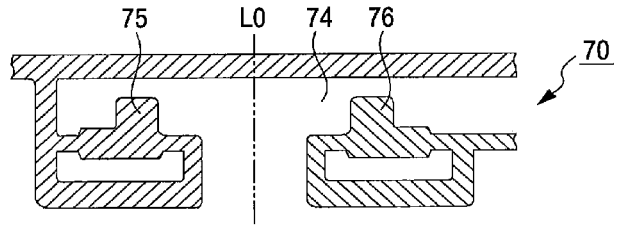
Figure 8D:
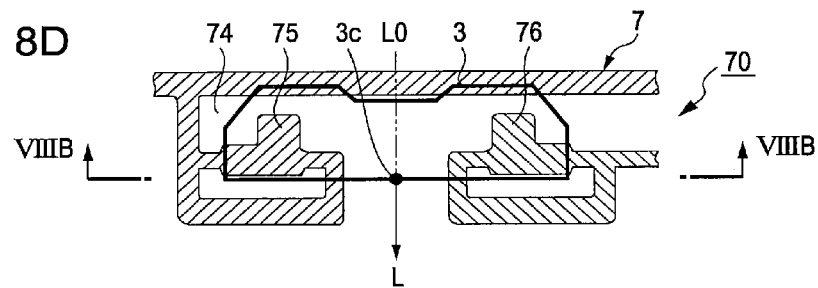
Figure 9A:
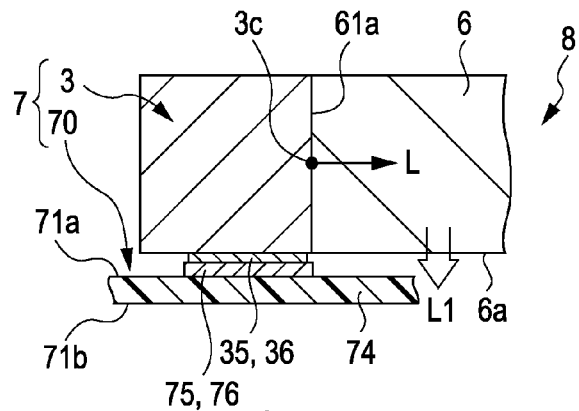
FIG. 9 are explanatory views of a mount structure according to a reference example of the invention.
Figure 9B:
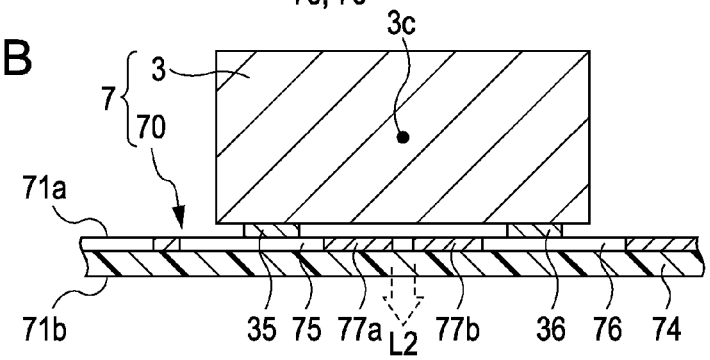
Figure 9C:
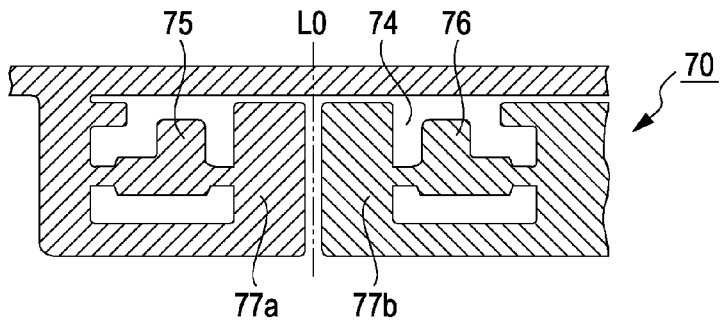
Figure 9D:
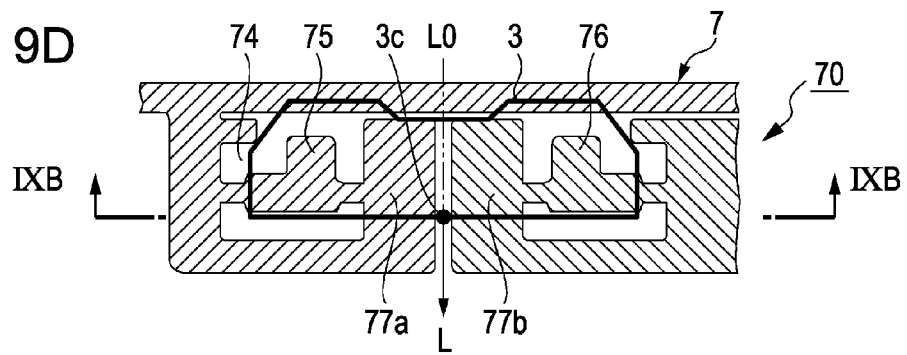

Next, electronic appliances to which the liquid crystal apparatus 100 of the above-described embodiments of the invention has been applied will be described. FIG. 7A illustrates the structure of a mobile personal computer 2000 provided with the liquid crystal apparatus 100. The personal computer 2000 includes the liquid crystal apparatus 100 serving as a display unit and a main assembly 2010. The main assembly 2010 includes a power source switch 2001 and a keyboard 2002. FIG. 7B illustrates the structure of a mobile telephone 3000 provided with the liquid crystal apparatus 100. The mobile telephone 3000 includes a plurality of operation buttons 3001, scroll buttons 3002 and the liquid crystal apparatus 100 serving as a display unit. FIG. 7C illustrates the structure of a mobile information terminal 4000 (personal digital assistant (PDA)) to which the liquid crystal apparatus 100 has been applied. The mobile information terminal 4000 includes a plurality of operation buttons 4001, a power source switch 4002 and the liquid crystal apparatus 100 serving as a display unit. When the power source switch 4002 is operated, a variety of information including an address book and a schedule are displayed on the liquid crystal apparatus 100.

Examples of electronic appliances to which the liquid crystal apparatus 100 is applied other than those illustrated in FIG. 7 include digital still cameras, liquid-crystal televisions, viewfinder-type and monitor direct-view-type video tape recorders, car navigation devices, pagers, electronic organizers, electronic calculators, word processors, work stations, video telephones, POS terminals and ATMs. The above-described liquid crystal apparatus 100 can be applied as a display unit of each of these types of electronic appliances.

The entire disclosure of Japanese Patent Application No. 2009-011670, filed Jan. 22, 2009 is expressly incorporated by reference herein.

What is claimed is:

1. A mount structure comprising:
   a wiring board;
   a semiconductor device composed of a light-emitting device or a light-receiving device mounted on one surface side of the wiring board such that an optical axis thereof is oriented in a direction that extends along a board surface of the wiring board; and
   a conductive layer formed only on the one surface side of the wiring board, the conductive layer including
      a first pad on which a first terminal of the semiconductor device is mounted,
      a second pad on which a second terminal of the semiconductor device is mounted, and
      a light shielding conductive layer that is formed between portions of the first pad and the second pad in plan view,
   wherein the first pad and the second pad are arranged on respective sides of an imaginary center line along which the optical axis of the semiconductor device extends, and
   wherein the light shielding conductive layer of the conductive layer is provided at a position beneath a light emission center or a light reception center of the semiconductor device in plan view.

2. The mount structure according to claim 1, wherein part of the light-shielding conductive layer protrudes from a region beneath the semiconductor device in plan view in a direction in which the optical axis extends.

3. The mount structure according to claim 1, wherein the light-shielding conductive layer extends in a direction opposite to that in which the optical axis extends from a position beneath the light emission center or the light reception center of the semiconductor device.

4. The mount structure according to claim 1, wherein the light-shielding conductive layer is directly connected to the first pad.

5. The mount structure according to claim 4, wherein the light-shielding conductive layer is provided at a leading end side of a connective portion that extends from the first pad and that has smaller width than the first pad.

6. The mount structure according to claim 1, wherein a ground potential is applied to the first pad and the light-shielding conductive layer.

7. The mount structure according to claim 1, wherein the semiconductor device is a light-emitting device.

8. An illumination apparatus comprising:
   the mount structure according to claim 7; and
   a light guide plate having a light incidence portion composed of a lateral end surface that faces the light emission center of the light-emitting device and a light emission surface from which light, which was incident from the light incidence portion, is emitted in a direction that intersects the lateral end surface.

9. A liquid crystal apparatus comprising: the illumination apparatus according to claim 8; and a liquid crystal panel that modulates and emits light emitted from the illumination apparatus.

10. The mount structure according to claim 1, wherein the light-shielding conductive layer is not directly connected to the first pad.

11. A mount structure comprising:
   a wiring board; and
   a semiconductor device composed of a light-emitting device or a light-receiving device mounted on one surface side of the wiring board such that an optical axis thereof is oriented in a direction that extends along a board surface of the wiring board;
   wherein a conductive layer is formed on the one surface side of the wiring board, the conductive layer including a first pad on which a first terminal of the semiconductor device is mounted, a second pad on which a second terminal of the semiconductor device is mounted, and a light-shielding conductive layer,
   wherein the first pad and the second pad are arranged on respective sides of an imaginary center line along which the optical axis of the semiconductor device extends,
   wherein the light-shielding conductive layer is provided at a position beneath a light emission center or a light reception center of the semiconductor device in plan view, and
   wherein the light-shielding conductive layer is provided at a leading end side of a connective portion that extends from the first pad and that has smaller width than the first pad.

* * * * *